US011670361B2

(12) United States Patent
Son et al.

(10) Patent No.: US 11,670,361 B2
(45) Date of Patent: Jun. 6, 2023

(54) SEQUENTIAL DELAY ENABLER TIMER CIRCUIT FOR LOW VOLTAGE OPERATION FOR SRAMS

(71) Applicant: Synopsys, Inc., Mountain View, CA (US)

(72) Inventors: Moon-Hae Son, San Jose, CA (US); Niranjan Behera, San Ramon, CA (US)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 17/377,080

(22) Filed: Jul. 15, 2021

(65) Prior Publication Data

US 2022/0020420 A1   Jan. 20, 2022

Related U.S. Application Data

(60) Provisional application No. 63/052,354, filed on Jul. 15, 2020.

(51) Int. Cl.
| | | |
|---|---|---|
| *G11C 11/4094* | (2006.01) | |
| *G11C 11/408* | (2006.01) | |
| *G11C 11/4076* | (2006.01) | |
| *H03K 19/017* | (2006.01) | |
| *G11C 11/4091* | (2006.01) | |
| *G11C 16/34* | (2006.01) | |
| *G11C 11/4096* | (2006.01) | |

(52) U.S. Cl.
CPC ...... *G11C 11/4085* (2013.01); *G11C 11/4076* (2013.01); *G11C 11/4091* (2013.01); *G11C 11/4094* (2013.01); *G11C 11/4096* (2013.01); *G11C 16/3404* (2013.01); *H03K 19/01742* (2013.01)

(58) Field of Classification Search
CPC .................................................. G11C 11/4085
See application file for complete search history.

(56) References Cited

U.S. PATENT DOCUMENTS

| 7,701,792 B2* | 4/2010 | Oh ........................ G11C 7/227 365/207 |
|---|---|---|
| 2006/0023521 A1* | 2/2006 | Gabric .................. G11C 11/413 365/189.11 |
| 2007/0002607 A1* | 1/2007 | Khellah ................ G11C 11/419 365/154 |
| 2015/0138868 A1* | 5/2015 | Castalino ........... G11C 16/0466 365/104 |

* cited by examiner

*Primary Examiner* — Min Huang
(74) *Attorney, Agent, or Firm* — Fenwick & West LLP

(57) ABSTRACT

An integrated circuit includes a memory cell array coupled to a bitline and a first wordline and a negative-type metal-oxide-semiconductors (NMOS) pull-down structure coupled to the bitline and PMOS transistors. The positive-type metal-oxide-semiconductors (PMOS) transistors may be coupled to a second wordline, where a logic value carried on the second wordline is based on a logic value carried on the first wordline, and the PMOS transistors are structured to pre-charge respective drains of the NMOS pull-down structure to a high logic value based on a low logic value carried on the second wordline. The NMOS pull-down structure may be structured to discharge the bitline based on a high logic value carried on the second wordline.

20 Claims, 9 Drawing Sheets

SEQUENTIAL DELAY ENABLER TIMER CIRCUIT FOR LOW VOLTAGE OPERATION FOR SRAMS

CROSS REFERENCE TO RELATED APPLICATIONS

This application claims the benefit of U.S. Provisional Application No. 63/052,354, filed Jul. 15, 2020, which is incorporated by reference in its entirety.

TECHNICAL FIELD

The disclosure generally relates to the field of low voltage operation for static random-access memory (SRAM) bitcells and in particular to read timer circuits for SRAM bitcell operation.

BACKGROUND

SRAM bitcells may operate in low voltage applications such as automotive and internet of things (IoT) products. These applications may require a wide operating voltage range yet may be supported by a lower supply voltage, $V_{DD}$. For example, 5-sigma SRAM bitcells may operate at low voltages such as 0.59 Volts (V), which may correspond to a read current that is slower (e.g., twenty times slower) than operations at higher voltage levels (e.g., 1.5 V). For such 5-sigma SRAM bitcells, a sufficient delay may be needed to obtain a corresponding voltage differential sensed by the sense amplifier at low $V_{DD}$ after the wordline rises to logic high. The delay may be needed because the voltage differential across bitlines increases slowly, which may be due in turn to the small read current of the 5-sigma SRAM bitcell. Further, there may be more variation in the voltage differential sensed by the sense amplifier at lower operating voltages. A sense amplifier trigger signal may have to be asserted at a time point when the sensing margin is greater than a minimum differential value between sense amplifier nodes corresponding to respective bitlines. Conventional SRAM cells may assert the sense amplifier trigger signal before this time point, which may cause invalid sensing and an unsuccessful read from the bitcell.

SUMMARY

Embodiments relate to timer circuits for low voltage operation for SRAM. In one embodiment, an integrated circuit includes a memory cell array coupled to a bitline and a first wordline and a negative-type metal-oxide-semiconductors (NMOS) pull-down structure coupled to the bitline and PMOS transistors. The positive-type metal-oxide-semiconductors (PMOS) transistors may be coupled to a second wordline, where a logic value carried on the second wordline is based on a logic value carried on the first wordline, and the PMOS transistors are structured to pre-charge drains of the NMOS pull-down structure to a high logic value based on a low logic value carried on the second wordline. The NMOS pull-down structure may be structured to discharge the bitline based on a high logic value carried on the second wordline.

The NMOS pull-down structure may include a first NMOS transistor coupled to the wordline, a second NMOS transistor, a PMOS transistor, and a third NMOS transistor. The second NMOS transistor may be coupled to the first NMOS transistor, the second wordline, and a PMOS transistor. The logic value carried on the second wordline may be based on a logic value carried on the first wordline. The PMOS transistor may be further coupled to the second wordline. The third NMOS transistor may be coupled to the second NMOS transistor and the bitline. The NMOS pull-down structure may include NMOS transistors coupled in series. Drains of the PMOS transistors can be coupled to the drains of the NMOS pull-down structure, sources of the PMOS transistors can be coupled to a supply voltage ($V_{DD}$), and gates of the PMOS transistors can be coupled to the second wordline.

The integrated circuit can further include a gate capacitance coupled to the NMOS pull-down structure such that the bitline is further discharged by the gate capacitance. The gate capacitance may be adjusted to modify an amount of time to discharge the bitline. The integrated circuit can further include a decoder coupled to the NMOS pull-down structure, where the decoder is structured to enable timing mode selection and output the logic value carried on the second wordline indicative of a selected timing mode. A time for the bitline to discharge can depend on the selected timing mode. The NMOS pull-down structure may include four NMOS transistors. The sources of the NMOS pull-down structure can be sequentially discharged based on the high logic value carried on the second wordline. In some embodiments, the integrated circuit can further include a gate capacitance coupled to an NMOS transistor of the NMOS pull-down structure having a source that is last to discharge. The memory cell array can have an SRAM architecture.

In one embodiment, a method for performing a read operation includes pre-charging NMOS transistors of an NMOS pull-down structure using PMOS transistors. The NMOS pull-down structure may be coupled to a bitline and the PMOS transistors. The method further includes discharging the NMOS transistors of the NMOS pull-down structure (e.g., the NMOS transistors discharging in sequence) and discharging, responsive to discharging the NMOS transistors, the bitline. A sense amplifier trigger signal may be enabled responsive to determining that the bitline has discharged to a threshold voltage level. To perform the read operation, a sense amplifier differential can be determined responsive to enabling the sense amplifier trigger signal. Pre-charging the NMOS transistors can include coupling a gate capacitance to a particular NMOS transistor of the NMOS pull-down structure such that the gate capacitance further pre-charges the source of the particular NMOS transistor.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

DETAILED DESCRIPTION

Aspects of the present disclosure relate to timer circuits for low voltage operation for SRAM. Low voltage operation for SRAM can be challenging when SRAM cells use self-timed circuits, or "timer circuits," to time themselves out after read or write operations, which may require a large read window. A timer circuit that includes a typical inverter chain (e.g., ten inverters) and a stacked pull-down structure may not be able to provide a sufficient read window. Described herein are systems and methods for achieving the read window needed for read or write operations in low voltage SRAM operations. In some embodiments, the use of gates is minimized to realize a timer circuit that achieves a sufficient read window while reducing the area with which the timer circuit occupies. For example, a timer circuit uses a stacked NMOS pull-down structure where nodes in the stack are enabled sequentially, which provides a delay needed for the read window. In particular, the timer circuit may cause the sense amplifier trigger signal to be asserted after delaying the discharge of a reference bitline (RBL) in a self-timing path. This configuration is referred to herein as a sequential delay enabler timer.

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Configuration Overview: Timer Circuits

Figure 1:
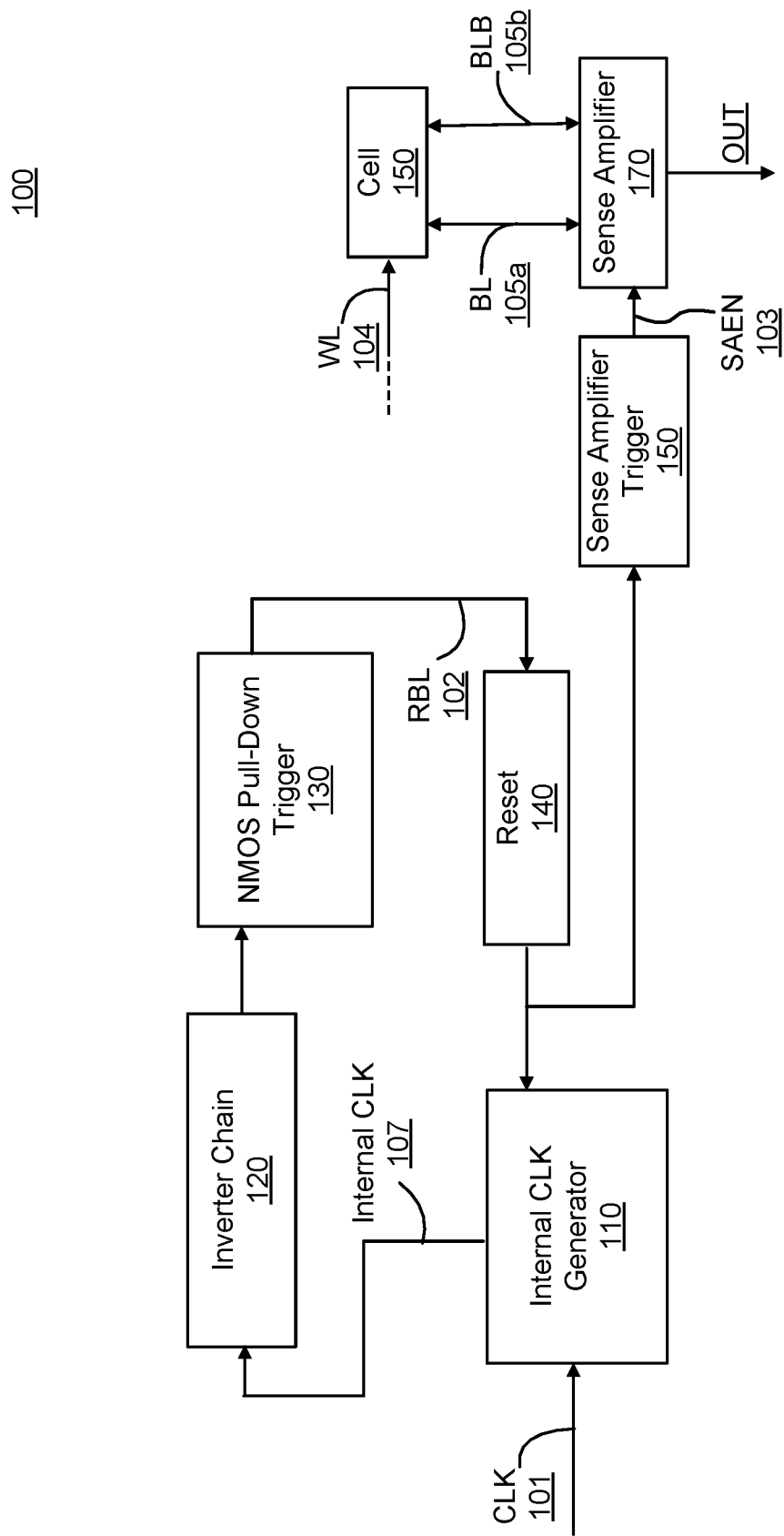
FIG. 1 depicts a block diagram of self-timing SRAM operations using an inverter chain read timer circuit, according to at least one embodiment.
Figure 2:
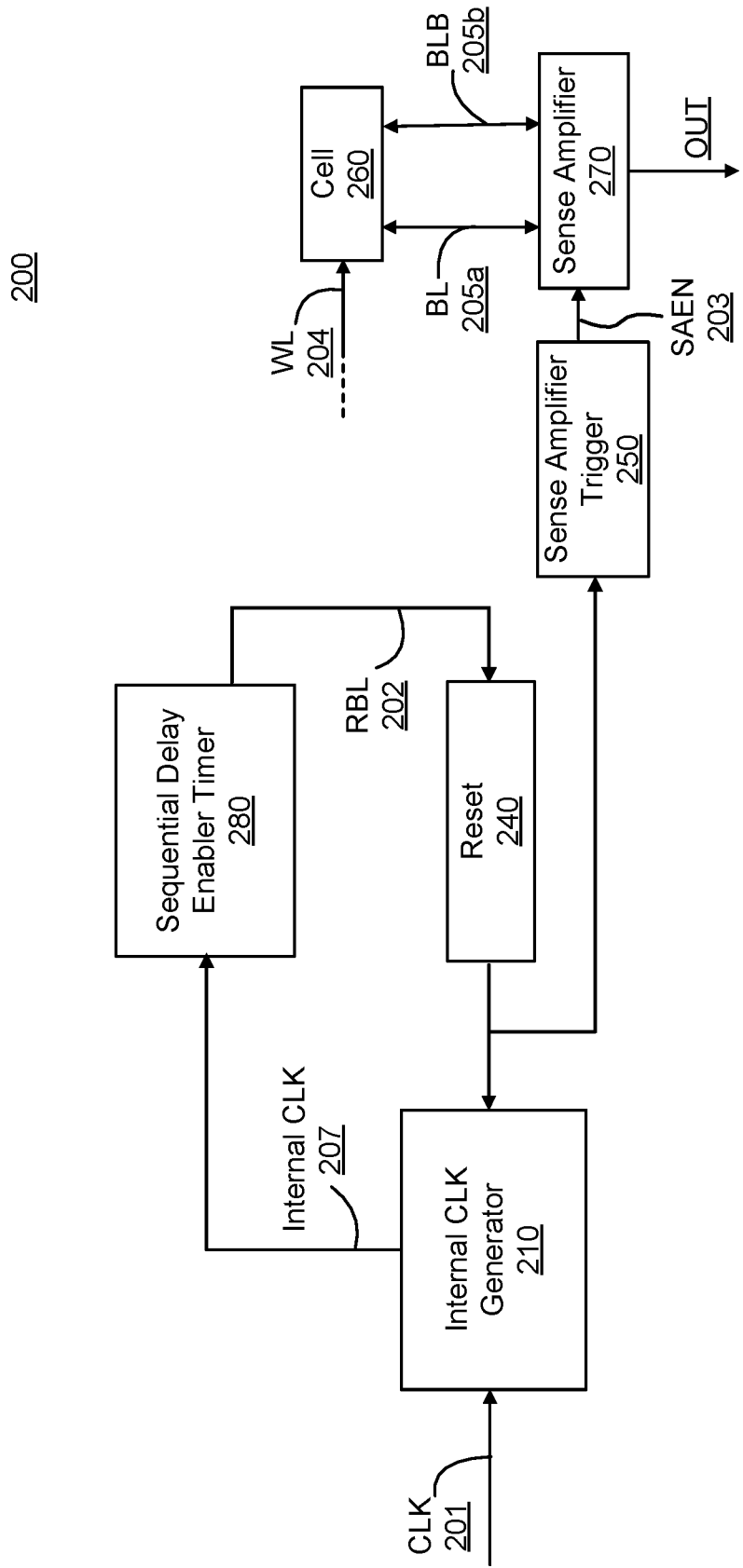
FIG. 2 depicts a block diagram of self-timing SRAM operations using the present sequential delay enabler read timer circuit, according to at least one embodiment.
Figure 3:
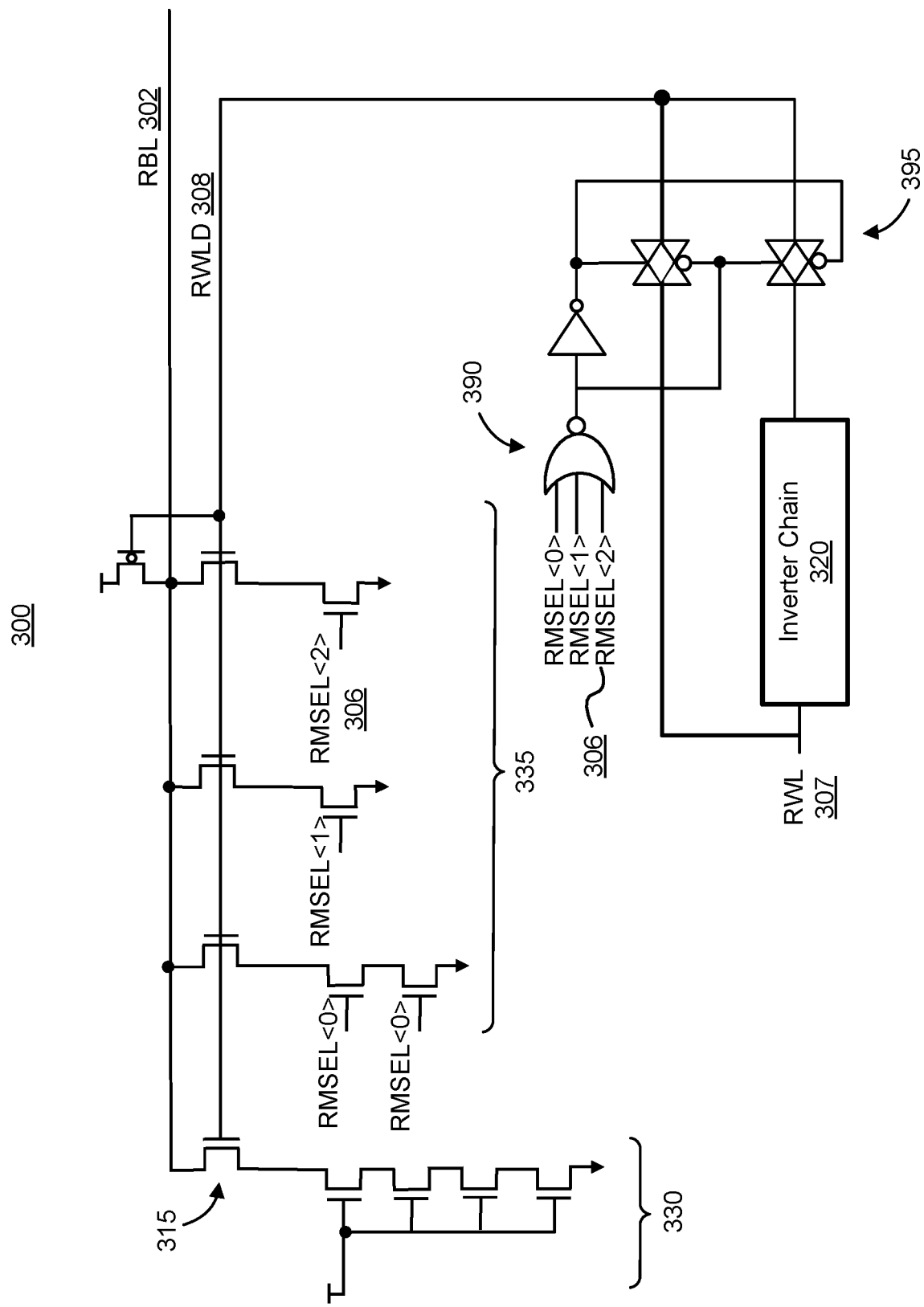
FIG. 3 shows a schematic diagram of an inverter chain read timer circuit, according to at least one embodiment.
Figure 4:
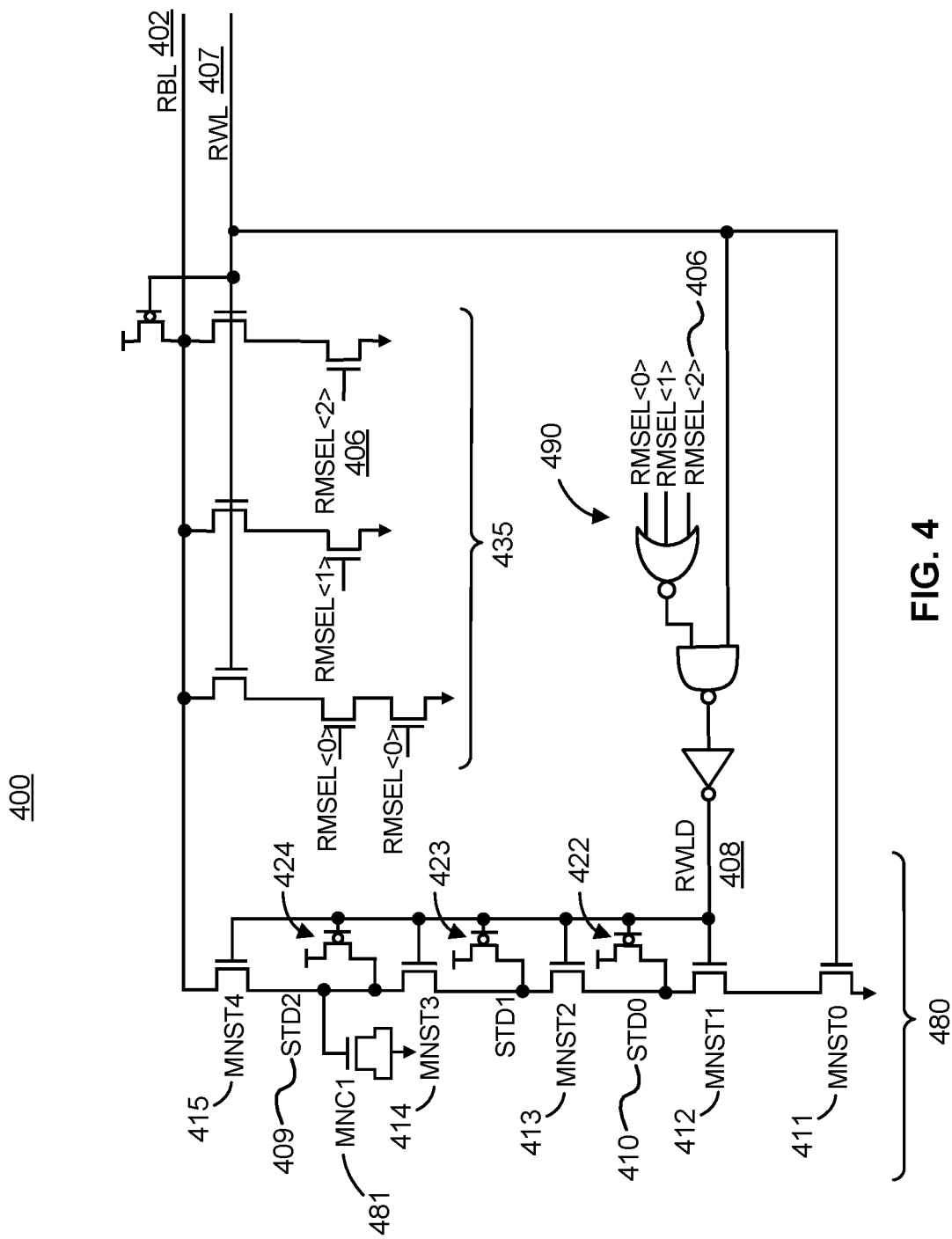
FIG. 4 shows a schematic diagram of the present sequential delay enabler read timer circuit, according to at least one embodiment.

Referring now to FIGS. 1-4, illustrated are diagrams representing the operations of timer circuits for reading from SRAM bitcells. In particular, the operations are performed at low voltages, which may require a longer time window to perform a successful read operation than at higher voltages. A read operation may require a minimum differential voltage between sense amplifier nodes corresponding to respective bitcell bitlines. The read timer circuits described herein may create a time window needed (e.g., 3 nanoseconds (ns)) to obtain this minimum differential voltage. FIGS. 1 and 3 show an inverter chain read timer circuit used to delay the trigger of a sense amplifier enable signal and obtain a sufficient voltage differential between bitlines. The voltage differential between bitlines may also be referred to herein as a "sense amplifier differential." FIGS. 2 and 4 show a sequential delay enabler read timer circuit for similar purposes.

FIG. 1 depicts a block diagram of a self-timing SRAM circuit using an inverter chain read timer circuit, according to at least one embodiment. The inverter chain read timer circuit contributes to the time window needed to read from an SRAM cell using a chain of inverters connected in a series (e.g., twenty to thirty inverters) 120 and an NMOS pull-down timer 130. This time window includes the time for an internal clock (CLK) signal to propagate through a chain of inverters and the time for the NMOS pull-down timer to discharge a pre-charged RBL signal. As referred to herein, "pre-charged" refers to a signal having a value of $V_{DD}$ or logic high. The terms "internal CLK" and "reference wordline" may be used interchangeably herein.

Circuit 100 includes components such as internal clock (CLK) generator 110, inverter chain 120, NMOS pull-down timer 130, reset 140, sense amplifier (SA) trigger 150, cell 160, and sense amplifier 170. These components may be represented in hardware or through software (e.g., via an electronic design automation (EDA) tool). Signals communicated between the hardware components include CLK 101, internal CLK 107, RBL 102, sense amplifier enable (SAEN) 103, wordline (WL) 104, bitline (BL) 105a, bitline bar (BLB) 105b, and an output of the read operation. Circuit 100 may have alternative configurations than shown in FIG. 1, including for example different, fewer, or additional components.

Internal CLK generator 110 generates internal CLK 107 for discharging RBL 102. Internal CLK generator 110 receives CLK 101 and is configured to activate internal CLK 107 in response to a logic high at CLK 101. As referred to herein, an "activated" signal is a signal whose value has been driven to logic high. Internal CLK generator 110 also receives the output of reset 140. In response to receiving a logic high output of reset 140, internal CLK generator 110 deactivates internal CLK 107. Internal CLK generator 110 is coupled to inverter chain 120.

Inverter chain 120 is a chain of inverters. Inverter chain 120 receives internal CLK 107 output by internal CLK generator 110. The number of inverters within the chain affects the time with which the discharging of RBL 102 is delayed. Each inverter in the chain adds a predetermined time for delaying the discharge of RBL 102 commensurate with the time spent to perform its function of inverting its input signal. In one example, to achieve at least a 3 nanosecond (ns) read window for sense amplifier 170 to capture a sufficient voltage differential between BL 105a and BLB 105b, inverter chain 120 includes a series of thirty inverters. Inverter chain 120 is coupled to NMOS pull-down timer 130. For example, a connection delivering a delayed internal CLK is coupled to inverter chain 120 and the gate of a transistor that is in turn coupled to NMOS pull-down timer 130. Although not depicted in FIG. 1, there may be an intermediary component at this connection such as a MUX between inverter chain 120 and the NMOS pull-down timer. These components and connections are depicted in the example circuit schematic of FIG. 3 (e.g., decoder 390 and MUX 395).

NMOS pull-down timer 130 is a stack of NMOS transistors. NMOS pull-down timer 130 receives a delayed internal CLK signal from inverter chain 120. The number of NMOS transistors in the stack may vary to adjust the delay with which RBL 102 is discharged. In some embodiments, NMOS pull-down timer 130 includes 4-5 NMOS transistors. The stack of NMOS transistors may be driven by $V_{DD}$ and serve as a path for the discharge of RBL 102 in response to a delayed reference wordline (RWLD) triggered to logic high. An example circuit schematic of an NMOS pull-down timer used to discharge an RBL signal is depicted in FIG. 3. NMOS pull-down timer 130 is coupled to reset 140 through RBL 302.

Reset 140 receives RBL 102 that is being discharged through NMOS pull-down timer 130 and generates a reset signal responsive to the value of RBL 102 reaching logic low or a reset threshold voltage. Reset 140 may include a comparator circuit that receives as input the reset threshold voltage and RBL 102, where reset 140 asserts a reset signal in response to the comparator circuit determining that the value of RBL 102 has decreased to or below the reset threshold voltage. The generated reset signal is provided to internal CLK generator 110 and sense amplifier trigger 150, which are coupled to reset 140.

Sense amplifier trigger 150 activates SAEN 103 in response RBL 102 discharging to a threshold voltage. For example, sense amplifier trigger 150 activates SAEN 103 responsive to receiving a reset signal generated by reset 140, which was generated by RBL 102 discharging to the reset threshold voltage. Sense amplifier trigger 150 is coupled to sense amplifier 170, which in response to receiving the activated SAEN 103, captures the voltage differential between bitlines BL 105a and BLB 105b to read the value stored in cell 160. Cell 160 may be an SRAM cell or any suitable bitcell for low voltage read operations. The term "bitcell" may also be referred to herein as a "memory cell." Cell 160 receives WL 104 and begins to discharge a bitline responsive to receiving an activated WL 104. Cell 160 may pre-charge bitlines (e.g., BL 105a and BLB 105b) in response to WL 104 deactivating. Sense amplifier 170 outputs the value read from cell 160.

In some embodiments, CLK 101 drives a read operation from cell 160. For example, on a logic high of CLK 101, internal CLK 107 generated by internal CLK generator 110 and WL 104 are both triggered to logic high. In response to a logic high at WL 104, cell 160 begins to pull-down one bitline (e.g., BLB 105b), creating a voltage differential between two bitlines (e.g., between BL 105a and BLB 105b). However, the read operation is not performed until SAEN 103 triggers the operation of sense amplifier 170 to obtain the voltage differential between BL 105a and BLB 105b. Sense amplifier 170 is activated by sense amplifier trigger 150, which is in turn activated by the discharging of RBL 102 due to operations among internal CLK generator 110, inverter chain 120, NMOS Pull-down Timer 130, and reset 140.

A cycle of the operations among internal CLK generator 110, inverter chain 120, NMOS Pull-down Timer 130, and reset 140 may begin with a logic high at CLK 101 and end with RBL pre-charging back to logic high. Within this cycle, sense amplifier 170 can perform a read operation of cell 160. In one example cycle, internal CLK 107 triggered to logic high by CLK 101 causes a pre-charged RBL 102 to discharge. However, the discharge may be delayed due to inverter chain 120 and NMOS pull-down timer 130 to create a time window needed for sense amplifier 170 to capture a sufficient voltage differential for a proper read operation. The delayed discharge of an RBL signal due to an inverter chain and NMOS pull-down timer is further described in the description of FIG. 3.

The discharging RBL 102, upon reaching logic low or a predefined voltage, causes reset 140 to activate sense amplifier trigger 150 and deactivate internal CLK 107 and WL 104 such that both signals become logic low. The activation of sense amplifier trigger 150 triggers SAEN 103 to logic high and sense amplifier 170 to capture the voltage differential between BL 105a and BLB 105b, completing the present read operation initiated at the beginning of the cycle. The logic low state of internal CLK 107 initiates the pre-charging for RBL 102 in preparation for the next read operation. An example cycle is further described in the description of the timing diagram depicted in FIG. 5.

FIG. 2 depicts a block diagram of a self-timing SRAM circuit using a sequential delay enabler read timer circuit, according to at least one embodiment. Circuit 200 replaces inverter chain 120 and NMOS pull-down timer 130 with sequential delay enabler timer 280. Sequential delay enabler timer 280 uses a pre-charged NMOS stack. Additionally, or alternatively, sequential delay enabler timer 280 may use a pre-charged gate capacitance. The pre-charged components of the sequential delay enabler timer 280 provide a delay to the discharging of RBL 202 that was provided in circuit 100 by inverter chain 120 and NMOS pull-down timer 130.

Circuit 200 includes components such as internal CLK generator 210, sequential delay enabler timer 280, reset 240, SA trigger 250, cell 260, and sense amplifier 270. These components may be represented in hardware or through software (e.g., via an electronic design automation (EDA) tool). Signals communicated between the hardware components include CLK 201, internal CLK 207, RBL 202, SAEN 203, WL 204, BL 205a, BLB 205b, and an output of the read operation. Internal CLK generator 210, reset 240, sense amplifier trigger 250, sense amplifier 270, and cell 260 of circuit 200 may behave similarly to corresponding components of circuit 100. For example, reset 240 activates a reset signal responsive to RBL 202 discharging to a reset threshold voltage similar to the operation of reset 140 and RBL 102. Components of circuit 200 may be coupled similarly to those of circuit 200. For example, reset 240 is coupled to internal CLK generator 210 and sense amplifier trigger 250, which is coupled to sense amplifier 270 that reads a voltage differential from bitlines of cell 260. Circuit 200 may have alternative configurations than shown in FIG. 2, including for example different, fewer, or additional components.

Sequential delay enabler timer 280 is coupled to internal CLK generator 210 and reset 240. Sequential delay enabler timer 280 may include a pre-charged stack of NMOS transistors and optionally, one or more gate capacitances to further increase the amount by which the NMOS transistors are pre-charged. The NMOS transistors may be pre-charged using PMOS transistors. The same signal may drive both NMOS transistors and the PMOS transistors such that the PMOS transistors operate to pre-charge nodes at the drains of the NMOS transistors when the driving signal (e.g., a delayed internal CLK signal) is at a logic low and the NMOS transistors operate to discharge the pre-charged nodes when the driving signal is at logic high. The pre-charging operation and the structure enabling the pre-charging is further described in the description of FIG. 4.

In some embodiments, similar to circuit 100, CLK 201 drives a read operation from cell 260. For example, on a logic high of CLK 201, internal CLK 207 generated by internal CLK generator 210 and WL 204 are both triggered to logic high. In response to a logic high at WL 204, cell 260 begins to pull-down one bitline (e.g., BLB 205b), creating a voltage differential between two bitlines (e.g., between BL 205a and BLB 205b). However, the read operation is not performed until SAEN 203 triggers the operation of sense amplifier 270 to obtain the voltage differential between BL 205a and BLB 205b. Sense amplifier 270 is activated by sense amplifier trigger 250, which is in turn activated by the discharging of RBL 202 due to operations among internal CLK generator 210, sequential delay enabler timer 280, and reset 240.

A cycle of the operations among internal CLK generator 210, sequential delay enabler timer 280, and reset 240 may begin with a logic high at CLK 201 and end with RBL pre-charging back to logic high. Within this cycle, sense amplifier 270 can perform a read operation of cell 260. In one example cycle, internal CLK 207 triggered to logic high by CLK 201 causes a pre-charged RBL 202 to discharge. However, the discharge may be delayed using sequential delay enabler timer 280 to create a time window needed for sense amplifier 270 to capture a sufficient voltage differential for a proper read operation. The delayed discharge of an RBL signal due to a sequential delay enabler timer is further described in the description of FIG. 4.

The discharging RBL 202, upon reaching logic low or a predefined voltage, causes reset 240 to activate sense amplifier trigger 250 and deactivate internal CLK 207 and WL 204 such that both signals become logic low. The activation of sense amplifier trigger 250 triggers SAEN 203 to logic high and sense amplifier 270 to capture the voltage differential between BL 205a and BLB 205b, completing the present read operation initiated at the beginning of the cycle. The logic low state of internal CLK 207 initiates the pre-charging for RBL 202 in preparation for the next read operation. An example cycle is further described in the description of the timing diagram depicted in FIG. 6.

FIG. 3 shows a schematic diagram of an inverter chain read timer circuit, according to at least one embodiment. Circuit 300 includes inverter chain 320 and NMOS pull-down 330, which serve to add delay between an activated CLK (e.g., CLK 101) at the start of a read operation cycle and an activated SAEN (e.g., SAEN 103) at the end of the read operation cycle. Circuit 300 further includes NMOS transistor 315, decoder 390, MUX 395, and read mode NMOS pull-down structures 335. Circuit 300 may have alternative configurations than shown in FIG. 3, including for example different, fewer, or additional components. For example, additional or fewer modes may be configured into decoder 390, which may increase or decrease the number of NMOS transistors within read mode NMOS pull-down structures 335. In another example, decoder 390, MUX 395, and read mode NMOS pull-down structures 335 may be omitted from circuit 300. This omission may cause each read from a bitcell coupled to circuit 300 to default to a delayed RBL 302 discharge caused by inverter chain 320 and NMOS pull-down 330.

The voltage differential between bitlines coupled to a bitcell may need to reach a sufficient voltage differential to successfully perform a read operation on the bitcell in a low voltage application. Inverter chain read timer circuit 300 can delay the discharge of RBL 302 to provide the time window for this voltage differential to be reached. In particular, circuit 300 delays the discharge of RBL 302 by passing RWL 307 through inverter chain 320, MUX 395, and NMOS pull-down 330. Without these delaying components, RBL 302 may discharge directly in response to an activated RWL, which would enable an NMOS transistor (e.g., NMOS 315) to be ON, causing the current to flow from RBL 302 to ground and thus, discharging RBL 302.

Inverter chain 320 may be similar to inverter chain 120 of FIG. 1. For example, inverter chain 320 may include a chain of thirty inverters to delay RWL 307. Inverter chain 320 is coupled to MUX 395, which is driven by the output of decoder 390 and receives both RWL 307 directly (e.g., from an internal CLK generator) and a delayed RWL 307 from inverter chain 320. Decoder 390 enables programmable selection of a read mode from one of various read modes such as RMSEL <0>, RMSEL <1>, and RMSEL <2>. Decoder 390 outputs a logic high in response to receiving an activated read mode selection signal. In response to decoder 390 outputting a logic high (e.g., due to a selection of a read mode), MUX 395 selects the direct RWL 307. In this way, the read modes, decoder 390, and MUX 395 enables circuit 300 to bypass inverter chain 320. Alternatively, a read mode is not selected, decoder 390 outputs a logic low, and in response, MUX 395 selects the output of inverter chain 320. Accordingly, circuit 300 is programmable to adapt to read operation requirements. For example, the SRAM bitcell may be used for a wireless, low voltage IoT application where inverter chain 320 is used and subsequently used for a wired, IoT application where inverter chain 320 may be bypassed with the selection of a read mode.

MUX 395 is coupled to read mode NMOS pull-down structures 335 and NMOS pull-down 330 through RWLD 308. NMOS transistor 315 is controlled by RWLD 308. The transistors of NMOS pull-down 330 may be kept at an ON state, driven by $V_{DD}$. In response to a logic high at RWLD 308, NMOS transistor 315 is set ON enabling RBL 302 to be discharged through NMOS pull-down 330. Optionally, an NMOS transistor coupled to one of read mode NMOS pull-down structures 335 is also set ON. However, depending on whether a particular read mode was selected, RBL 302 may or may not discharge through a pull-down of read mode NMOS pull-down structures 335.

RWL 307 is input into circuit 300 (e.g., from an internal CLK generator) and although not depicted, RBL 302 is coupled to another component (e.g., reset 140) that determines whether the value of RBL 302 has discharged to a threshold voltage. In a first example of RBL 302 discharging within circuit 300, no read mode is activated (i.e., selected) and MUX 395 selects RWL 307 that has passed through inverter chain 320. RWLD 308 is thus a delayed version of RWL 307 and drives NMOS transistor 315 to be ON, initiating the discharge of RBL 302 through NMOS pull-down 330. The NMOS transistors in structures 335 are OFF since no read mode has been activated to drive them to be ON. In this way, the discharge of RBL 302 is delayed by inverter chain 320 and NMOS pull-down 330.

In a second example, circuit 300 also receives as input an activated read mode select signal of RMSEL <2> 306 that is input into decoder 390. Activated RMSEL <2> 306 causes MUX 395 to select RWL 307 that bypasses inverter chain 320. Activated RMSEL <2> 306 also causes the corresponding structure in read mode NMOS pull-down structures 335 to be set ON, enabling the discharge of RBL 302 through an NMOS in structures 335. Since RWLD 308 also drives NMOS transistor 315 and NMOS pull-down 330 is always ON due to being driven by $V_{DD}$, RBL 302 further discharges through NMOS pull-down 330.

FIG. 4 shows a schematic diagram of a sequential delay enabler read timer circuit, according to at least one embodiment. Circuit 400 includes sequential delay enabler timer 480, which serves to add delay between an activated CLK (e.g., CLK 201) at the start of a read operation cycle and an activated SAEN (e.g., SAEN 203) at the end of the read operation cycle. Circuit 400 further includes decoder 490, and read mode NMOS pull-down structures 435. Circuit 400 may have alternative configurations than shown in FIG. 4, including for example different, fewer, or additional components. For example, decoder 490 and read mode NMOS pull-down structures 435 may be omitted from circuit 400. This omission may cause each read from a bitcell coupled to circuit 400 to default to a delayed RBL 402 discharge caused by sequential delay enabler timer 480.

The voltage differential between bitlines coupled to a bitcell may need to reach a sufficient voltage differential to successfully perform a read operation on the bitcell in a low voltage application. Sequential delay enabler timer 480 can delay the discharge of RBL 402 to provide the time window for this voltage differential to be reached. In particular, circuit 400 delays the discharge of RBL 402 by pre-charging transistors of sequential delay enabler timer 480. Circuit 400 is configured such that the pre-charged transistors of sequential delay enabler timer 480 must be discharged prior to RBL 402 discharging. Optional gate capacitances are included within sequential delay enabler timer 480 to increase the amount of pre-charging that must be discharged before RBL 402 is discharged. Without these delaying components, RBL 402 may discharge directly in response to an activated RWL, which would sequentially activate RWLD 408 and enable NMOS 315 to be ON, causing the current to flow from RBL 402 to ground and thus, discharging RBL 402.

Decoder 490 enables programmable selection of a read mode from one of various read modes such as RMSEL <0>, RMSEL <1>, and RMSEL <2>. Decoder 490 outputs a logic high in response to receiving an activated read mode selection signal. In response to decoder 490 outputting a logic high (e.g., due to a selection of a read mode), RWLD 408 is activated. Similarly, when RWL 407 is logic high, RWLD 408 is activated. In this way, the selection of a read mode, the activation of RWL 407, or a combination thereof activates sequential delay enabler timer 480 to begin discharging RBL 402. However, while the value of RWLD determines whether RBL 302 discharges through read mode NMOS pull-down structure 335 of circuit 300, the value of RWL determines whether RBL 402 discharges through read mode NMOS pull-down structures 435 of circuit 400. Therefore, when both RWL 407 is logic high and a read mode has been selected, RBL 402 can begin to discharge through structures 435 while sequential delay enabler timer 480 is discharging its pre-charged transistor nodes. If no read mode is selected, RBL 402 cannot discharge through structures 435 and its discharge is consequently delayed by sequential delay enabler timer 480. Accordingly, circuit 400 enables the bypass of sequential delay enabler timer 480 when a read mode is selected. This programmability allows circuit 400 to adapt to read operation requirements similar to how read modes in circuit 300 allows circuit 300 to adapt to different applications' requirements.

Sequential delay enabler timer 480 includes NMOS transistors 411, 412, 413, 414, and 415. PMOS transistors 422, 423, and 424, and gate capacitance 481. Sequential delay enabler timer 480 may have alternative configurations than shown in FIG. 4, including for example different, fewer, or additional components. For example, gate capacitance 481 may be omitted or additional gate capacitances at other transistors' drain nodes (e.g., node 410 of transistor 412) may be included to increase the amount of voltage to be discharged before RBL 402 is discharged. In some embodiments, the number of PMOS transistors used to pre-charge NMOS transistors in a sequential delay enabler timer circuit is one less than the number of NMOS transistors. For example, FIG. 4 shows three pre-charging PMOS transistors 422-424 and four pre-charged NMOS transistors 412-415.

Sequential delay enabler timer 480 uses PMOS transistors 422, 423, and 424 to pre-charge drain nodes of NMOS transistors 412, 413, and 414, respectively. PMOS transistors 422-424 may be structured to pre-charge respective drains of the NMOS pull down structure to a high logic value based on a low logic value carried on RWLD 408. PMOS transistors 422, 423, and 424 are ON and NMOS transistors 412, 413, 414, and 415 are OFF when RWLD 408 is at logic low. Further, each of PMOS transistors 422, 423, and 424 are coupled to $V_{DD}$. Thus, when RWLD 408 is at logic low, each of the NMOS transistors 412, 413, and 414 are pre-charged to $V_{DD}$. In one example structure, drains of respective PMOS transistors are coupled to drains of respective NMOS transistors to pre-charge the NMOS transistors. For example, the drain of PMOS transistor 423 is connected to the drain of NMOS transistor 413, pre-charging transistor 413 to VDD. Transistor 413 discharges from VDD to ground through at least NMOS transistors 412 and 411. The drain of NMOS transistor 415 may be pre-charged due to the pre-charging of RBL 402 at the end of each read cycle.

The combined structure of NMOS transistors 411-415 is also an NMOS pull-down structure and may be referred to herein as an "NMOS pull-down structure," which is separated from read mode NMOS pull-down structures 435 (i.e., a read model selection signal does not drive NMOS transistors 411-415), which are referred to herein as "read mode NMOS pull-down structures." The NMOS pull down structure may be structured to discharge RBL 402 based on a high logic value carried on RWLD 408. When RWLD 408 is logic high, PMOS transistors 422, 423, and 424 are OFF and NMOS transistors 412, 413, and 414 are ON. NMOS transistors 412, 413, and 414 will then begin to discharge to ground through transistor 411, which is ON when RWL 407 is activated. The discharge will begin sequentially, beginning at transistor 412. After transistor 412 discharges such that its drain is at a particular voltage level for transistor 413 to also begin discharging, transistor 413 begins to discharge. Similarly, transistors 414 and 415 will begin to discharge after their respective source nodes have reached a particular voltage level to cause current to flow from their respective drain to source nodes. Of the NMOS transistors within sequential delay enabler timer 480, transistor 415 may be discharged last.

Gate capacitance 481 may increase resistive capacitive (RC) delay at node 409. For example, while transistor 412 discharges the pre-charge at node 410 contributed by PMOS transistor 422, transistor 414 discharges the pre-charge at node 409 contributed by both PMOS transistor 424 and gate capacitance 481. Accordingly, node 409 takes a longer time than node 410 to discharge. Once all NMOS transistors have begun discharging, RBL 402 is discharged. Thus, the discharge of RBL 402 is delayed according to the amount with which sequential delay enabler timer 480 is pre-charged.

The capacitance of gate capacitance 481 may be adjustable. The area that circuit 400 occupies may be considered when adjusting the capacitance. For example, the greater the capacitance, the greater the height may be of circuit 400. In some embodiments, any combination of NMOS drain nodes of sequential delay enabler timer 480 may be coupled to a gate capacitance to increase the delay before RBL 402 discharges. For example, for a read operation at a lower voltage of 0.55 Volts (V) where a 4 nanoseconds (ns) time window for a read operation may be required, additional gate capacitances may be added to achieve the 4 ns time window. The number of NMOS and PMOS transistors in sequential delay enabler timer 480 may also be increased or decreased to adjust how much the discharge of RBL 402 is delayed. The configuration shown in FIG. 4 may help achieve a 3 ns time window for a read operation.

RWL 407 is input into circuit 400 (e.g., from internal CLK generator 210) and although not depicted, RBL 402 is coupled to another component (e.g., reset 240) that determines whether the value of RBL 402 has discharged to a threshold voltage. In a first example of RBL 402 discharging within circuit 400, no read mode is activated and when RWL 407 is logic high, RBL 402 will discharge through sequential delay enabler timer 480 once the NMOS transistors of sequential delay enabler timer 480 are discharged. In this example, RBL 402 does not discharge through read mode NMOS pull-down structures 435 since the logic low read mode select signals prevents RBL 402 from discharging through structures 435.

In a second example, circuit 400 also receives as input an activated read mode select signal of RMSEL <2> 406 that is input into decoder 490. Activated RMSEL <2> 406 causes one or more corresponding NMOS transistors of read mode NMOS pull-down structures 435 to be set ON, enabling the discharge of RBL 402 through the one or more corresponding NMOS transistors of structures 335. Because RBL 402 can begin discharging before sequential delay enabler timer 480 has discharged its NMOS transistors, the selection of a read mode reduces the amount of delay before RBL 402 is discharged. This may be beneficial for applications that do not require a large read window to create a sufficient voltage differential between bitlines of a bitcell (e.g., wired applications without low voltage constraints).

Configuration Operation and Timing

Figure 5:
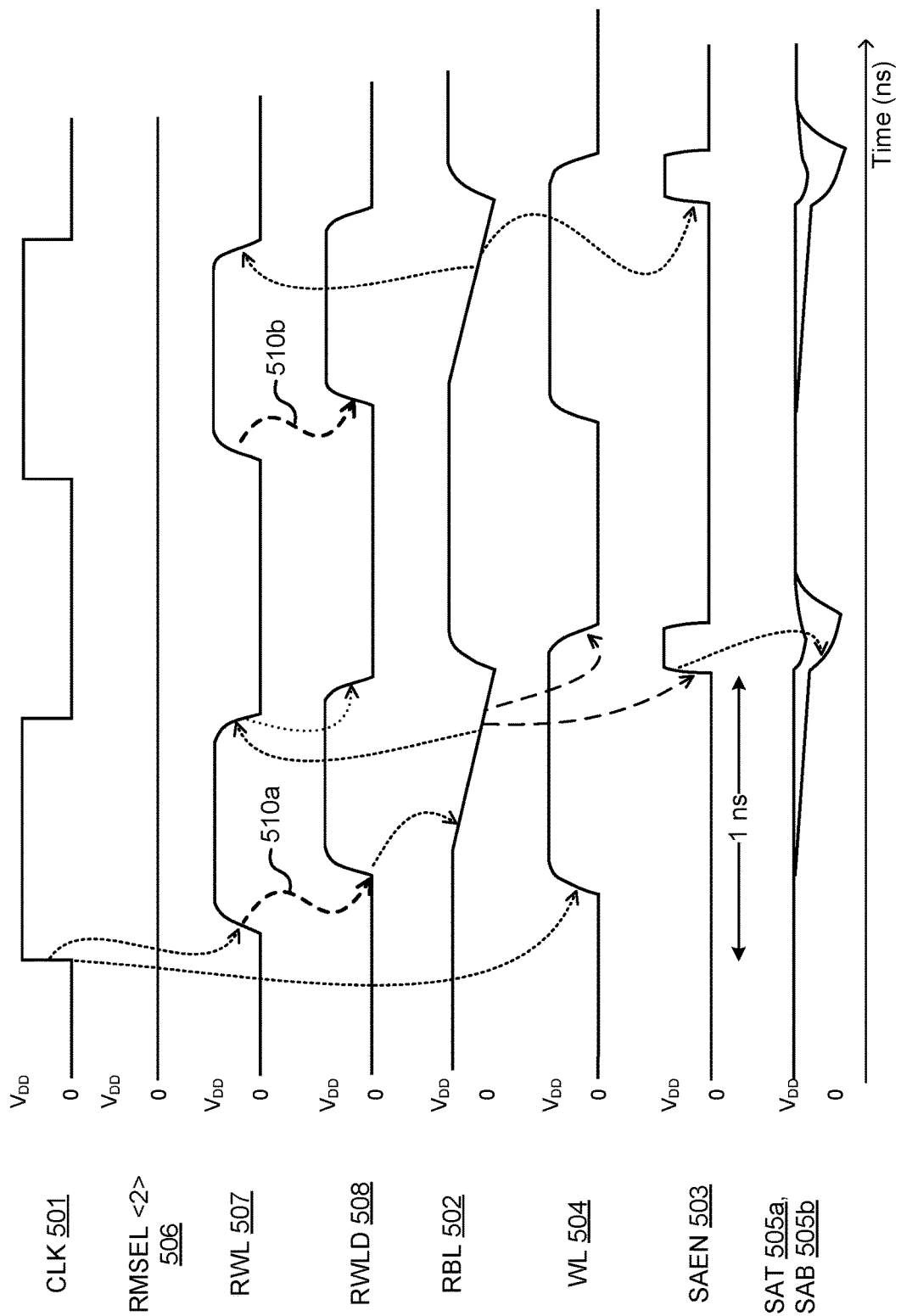
FIG. 5 illustrates a timing diagram of a read operation involving an inverter chain read timer circuit, according to at least one embodiment.
Figure 6:
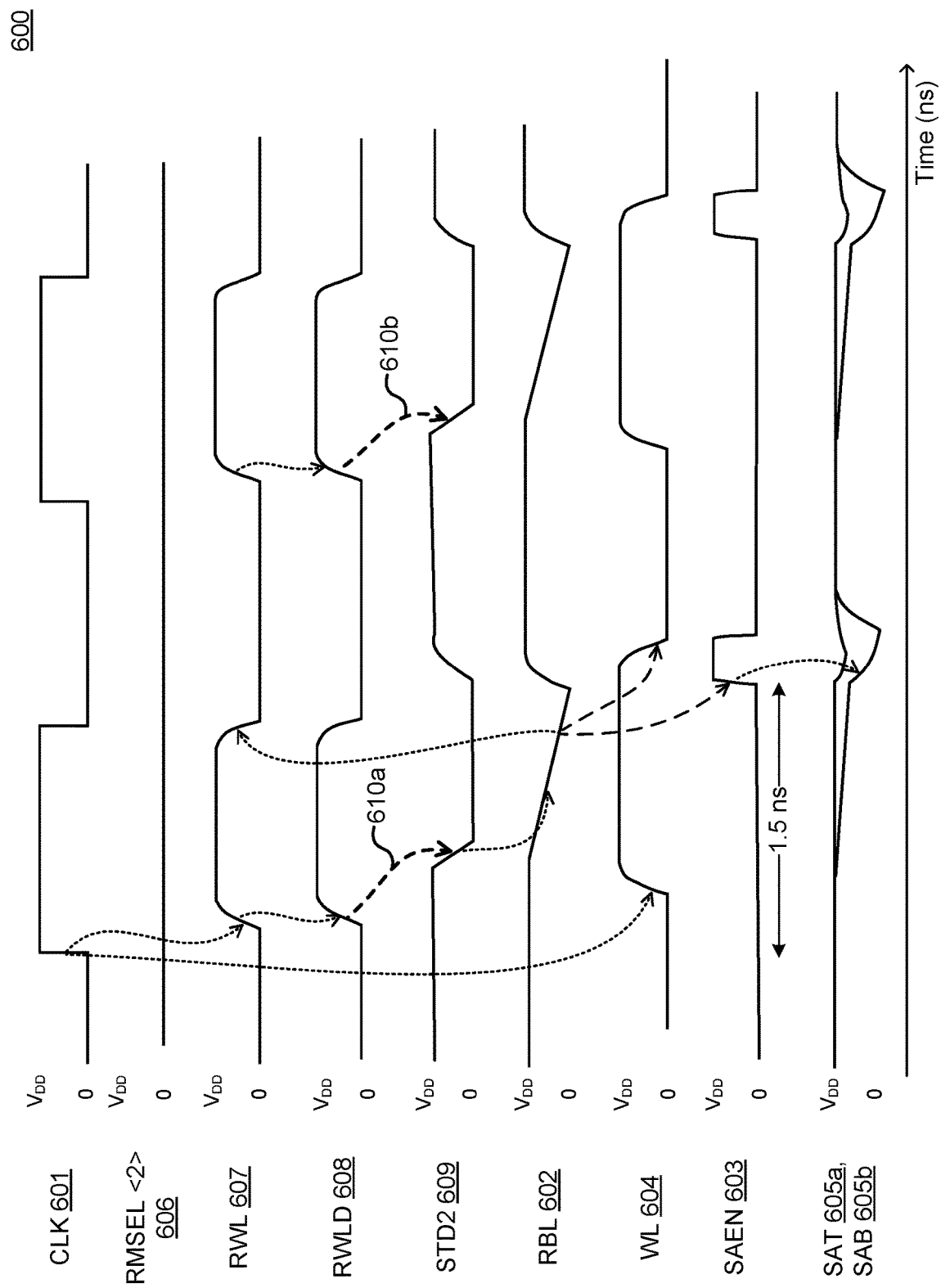
FIG. 6 illustrates a timing diagram of a read operation involving a sequential delay enabler read timer circuit, according to at least one embodiment.

Referring now to FIGS. 5-6, illustrated are diagrams showing the timing of signals through an inverter chain timer circuit and a sequential delay enabler timer circuit respectively. Each of the diagrams in FIGS. 5-6 depict voltage values of various signals over time. The clock cycles shown in FIGS. 5 and 6 may be equivalent in duration. For example, each clock cycle may have a duration of 1.75 nanoseconds. FIG. 5 depicts the delay of a sense amplifier enable signal by approximately 1 ns (i.e., the time from the start of a clock cycle to the logic high of the sense amplifier enable signal is 1 ns) when operating at a $V_{DD}$ of 0.63 V. Although not depicted, the sense amplifier enable signal may be delayed via an inverter chain timer circuit by approximately 2 ns when operating at a $V_{DD}$ of 0.59 V. FIG. 6 depicts the delay of a sense amplifier enable signal by approximately 1.5 nanoseconds when operating at a $V_{DD}$ of 0.63V. At a $V_{DD}$ of 0.59 V, the sense amplifier enable signal may be delayed via an sequential delay enabler timer circuit by approximately 3.5 ns.

FIG. 5 illustrates a timing diagram of a read operation involving an inverter chain read timer circuit (e.g., circuit 300 of FIG. 3), according to at least one embodiment. Diagram 500 shows the values of various signals during a read cycle: CLK 501, read mode selection signal "RMSEL <2>" 506, RWL 507, RWLD 508, RBL 502, WL 504, SAEN 503, and bitline signals SAT 505a and SAB 505b. Bitlines signals SAT and SAB may also be referred to herein as BL and BLB respectively. The signals of diagram 500 may correspond to like signals in FIGS. 1 and 3. For example, CLK 501 may correspond to CLK 101 and RBL 502 may correspond to RBL 102 and RBL 302. The values illustrated in diagram 500 show one example read cycle involving an inverter chain read timer circuit. A read cycle may vary depending on user input and thus, may result in differing timing diagram values. For example, the user selection of read mode selection signal 506 bypasses the inverter chain and causes RWLD 508 to follow RWL 507 with less delay than shown in FIG. 5.

The read cycle begins with CLK 501 activating. A logic high at CLK 501 causes RWL 507 and WL 504 to be activated. Activating WL 504 causes a bitline (e.g., SAB 505b) to discharge, where the bitline is coupled to a bitcell that is being read from in the read cycle. As described in FIGS. 1 and 3, activating RWL 507 causes RBL 502 to discharge. In particular, RWLD 508 activates in response to RWL 507 activating, and RWLD 508 drives one or more NMOS transistors involved in discharging RBL 502. The amount of delay with which RWLD 508 subsequently activates can depend on whether or not a read mode is selected. As illustrated in diagram 500, read mode signal 506 is not selected. Although not depicted in diagram 500, the example read cycle depicted does not include the selection of another read mode signal (e.g., RMSEL <0> or RMSEL <1> of FIG. 3). Thus, an inverter chain is not bypassed and RWLD 508 is activated after RWL 507 is delayed through the inverter chain (e.g., inverter chain 320). This delay is depicted by arrow 510a showing the trigger of logic high at RWLD 508 from logic high at RWL 507 after the inverter chain's delay.

RBL 502 begins to discharge in response to a logic high at RWLD 508. When RBL 502 has discharged to a threshold voltage (e.g., a reset threshold voltage), SAEN 503 is activated and both WL 504 and RWL 507 are reset to logic low. This is depicted in FIG. 1 through reset 140, which determines that the RBL signal has discharged to the reset threshold voltage and provides a reset signal to internal CLK generator 110 and sense amplifier trigger 150. A sense amplifier trigger activates SAEN 503 to cause a sense amplifier to obtain the voltage differential between bitlines SAT 505a and SAB 505b coupled to the bitcell. When RWL 507 is reset to logic low, the signal may travel through the inverter chain again and subsequently deactivate RWLD 508, which sets the previously ON NMOS transistors to OFF, allowing RBL 502 to pre-charge again for the next read cycle. This is depicted in diagram 500, where RBL 502 begins to pre-charge after RWLD 508 reaches logic low. The end of the read cycle may be indicated by the start of pre-charging for RBL 502. A second, subsequent read cycle is also shown in diagram 500, where the delay of RWLD 508 due to RWL 507 passing through an inverter chain is shown through arrow 510b.

FIG. 6 illustrates a timing diagram of a read operation involving a sequential delay enabler read timer circuit (e.g., circuit 400), according to at least one embodiment. Diagram 600 demonstrates how the additional delay due to pre-charging using a sequential delay enabler timer (e.g., timer 480) causes RBL 602 to be delayed similarly to the delay of RBL 502 due to an inverter chain. The additional delay is reflected in diagram 500 via STD2 609, which is also depicted as node 409 in FIG. 4 and includes the pre-charge from both gate capacitance 481 and PMOS transistor 424. The discharge at RBL 602 does not begin until STD2 609 begins to discharge. The delay between the activation of RWLD 608 and the discharge of STD2 609, which begins after other NMOS transistors in the sequential delay enabler timer discharge, is reflected in respective read cycles through arrows 610a and 610b. After MNST4 is turned on, the delay before RBL 602 discharges may depend on the RC value of the stacked NMOS transistors and optionally, one or more gate capacitances between RBL 602 and for example, transistor 415 of sequential delay enabler timer 480. RBL 602 may be pulled to logic low slowly by the stacked NMOS transistors of a sequential delay enabler timer.

Diagram 600 shows the values of various signals during a read cycle: CLK 601, read mode selection signal "RMSEL <2>" 606, RWL 607, RWLD 608, STD2 609, RBL 602, WL 604, SAEN 603, and bitline signals SAT 605a and 605b. These signals may correspond to like signals in FIGS. 2 and 4. For example, CLK 601 may correspond to CLK 201 and RBL 602 may correspond to RBL 202 and RBL 402. The values illustrated in diagram 600 show one example read cycle involving a sequential delay enabler read timer circuit. A read cycle may vary depending on user input and thus, may result in differing timing diagram values. For example, the user selection of read mode selection signal 606 can cause RBL 602 to follow RWL 607 with less delay than shown in FIG. 6.

The read cycle begins with CLK 601 activating. A logic high at CLK 601 causes RWL 607 and WL 604 to be activated. Activating WL 604 causes a bitline (e.g., SAB 605b) to discharge, where the bitline is coupled to a bitcell that is being read from in the read cycle. As described in FIGS. 2 and 4, activating RWL 607 causes RBL 602 to discharge. In particular, RWLD 608 activates in response to RWL 607 activating, and RWLD 608 drives NMOS transistors in a sequential delay enabler timer involved in discharging RBL 602. The amount of delay with which RBL 602 discharges can depend on whether or not a read mode is selected. As illustrated in diagram 600, read mode signal 606 is not selected. Although not depicted in diagram 600, the example read cycle depicted does not include the selection of another read mode signal (e.g., RMSEL <0> or RMSEL <1> of FIG. 3). Thus, RBL 602 discharges through a sequential delay enabler timer without discharging through read mode NMOS pull-down timer structures (e.g., structures 435).

The discharge of RBL 602 is delayed via pre-charged nodes in the sequential delay enabler timer such as shown in signal STD2 609 of a node such as node STD2 409. The delay of discharging of pre-charged signal STD2 609 is depicted by arrow 610a showing discharging triggered after a logic high at RWLD 608. The time between the logic high at RWLD 608 and beginning of STD2 609 discharging may be increased if for example, additional gate capacitances are added to the sequential delay enabler timer as described in the description of FIG. 4.

RBL 602 begins to discharge in response to the discharging of STD2 609. When RBL 602 has discharged to a threshold voltage (e.g., a reset threshold voltage), SAEN 603 is activated and both WL 604 and RWL 607 are reset to logic low. This is depicted in FIG. 2 through reset 240, which determines that the RBL signal has discharged to the reset threshold voltage and provides a reset signal to internal CLK generator 210 and sense amplifier trigger 250. A sense amplifier trigger activates SAEN 603 to cause a sense amplifier to obtain the voltage differential between bitlines SAT 605a and SAB 605b coupled to the bitcell.

When RWL 607 is reset to logic low, RBL 602 will begin to pre-charge in response to prepare for the next read cycle. This is depicted in diagram 600, where RBL 602 begins to pre-charge after RWL 607 reaches logic low. In contrast to the reset of RWL 507 to logic low that travels through an inverter chain again before RBL 502 can begin pre-charging, there can be less delay between the reset of RWL 607 and the pre-charge of RBL 602 in a read cycle involving a sequential delay enabler read timer circuit (e.g., as shown in FIG. 4). This may be due to the structure of RWL 607 coupled to NMOS transistors whose OFF state allows RBL 602 to pre-charge and the relatively faster travel time through a NAND gate and a single inverter compared to an inverter chain that causes RWLD to set another NMOS transistor (e.g., transistor 415) to OFF and allow RBL 602 to pre-charge. The end of the read cycle may be indicated by the start of pre-charging for RBL 602. A second, subsequent read cycle is also shown in diagram 600, where the delay of the discharge STD2 609 after the activation of RWLD 608 is shown through arrow 610b.

Figure 7:
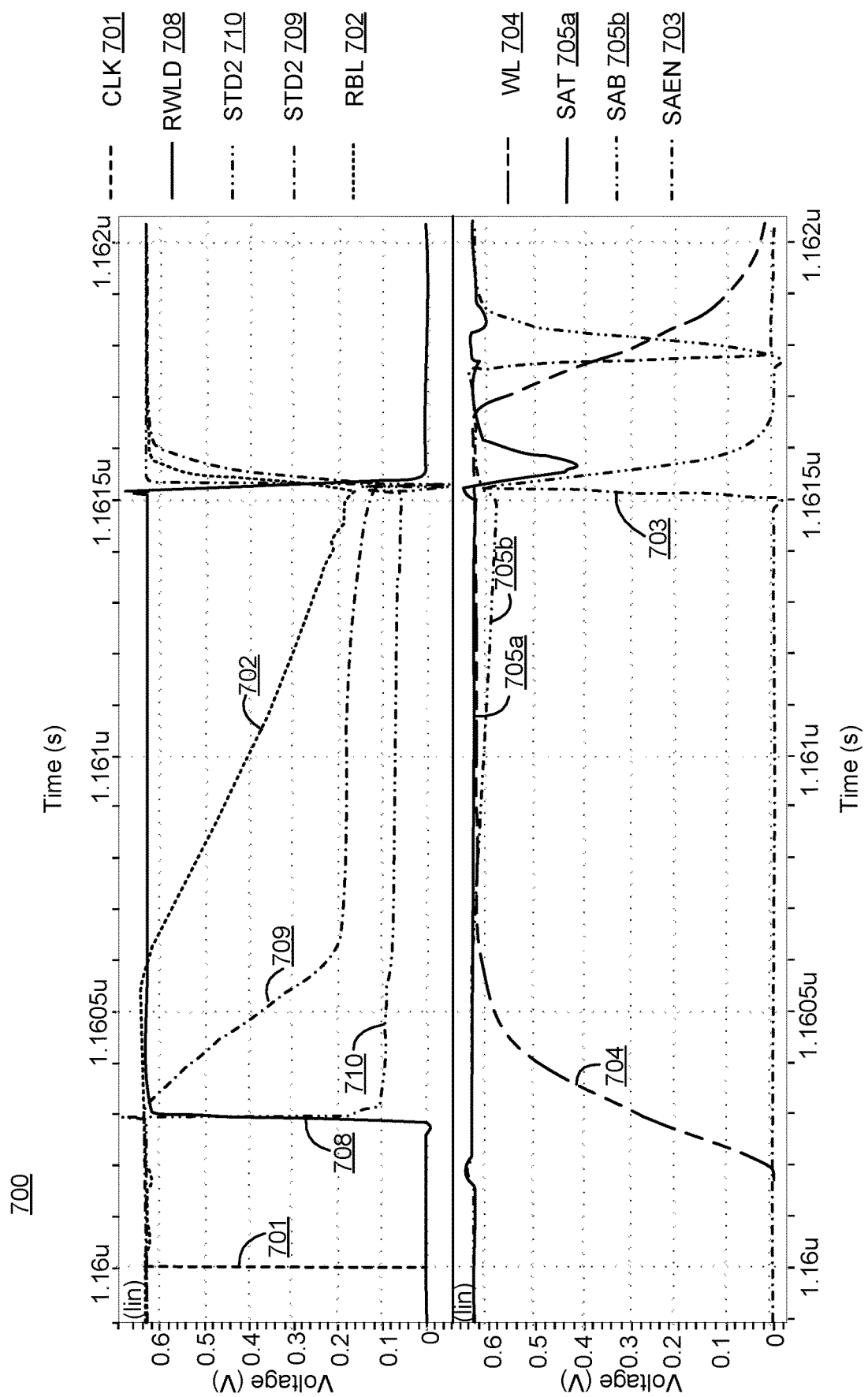
FIG. 7 depicts simulation results of a sequential delay enabler read timer circuit, according to at least one embodiment.

FIG. 7 depicts simulation results 700 of a read cycle using sequential delay enabler read timer circuit, according to at least one embodiment. The simulation results 700 were obtained using a $V_{DD}$ at 0.63 V, which created a read window requirement of approximately 1.5 ns. In embodiments where an SRAM bitcell operates with a $V_{DD}$ of 0.59 V, the read window may be greater than 3 ns. Simulation results 700 is split into two graphs of signals plotted against the same time x-axis and current supply y-axis. As described in the description of FIG. 6, a read cycle begins as CLK 701 activates, triggering WL 704 to logic high and SAB 705b to discharge. SAB 705b may be given sufficient time window to discharge such that there is a voltage differential between bitlines SAT 705a and SAB 705b for a successful read of the corresponding bitcell. To provide this time window, SAEN 703 is not triggered until RBL 702 discharges to a threshold voltage. In some embodiments, a threshold current may be used in addition or alternative to a threshold voltage. For example, in simulation results 700, SAEN 703 is not triggered until the current across RBL 702 discharges to approximately 0.2 A. RBL 702 does not begin to discharge until the current across STD2 709 has discharged to a particular level, and further, STD2 709 does not begin to discharge until other NMOS transistors in the NMOS stack of the sequential delay enabler timer has discharged (e.g., until STD0 and STD1 have discharged).

As shown in simulation results 700, STD0 710 discharges before STD2 709 begins to discharge. The time that STD0 710 takes to discharge is shorter than the time that STD2 709 takes to discharge. This may be due to a gate capacitance (e.g., gate capacitance 481) at STD2, which increases the RC value of the NMOS stack. Once RBL 702 has discharged to a threshold voltage or current value, WL 704 and RWLD 708 are reset to logic low. When RWLD 708 is reset to logic low, RBL 702 begins to pre-charge again and the read cycle ends.

Electronic Design Automation System and Workflow

Figure 8:
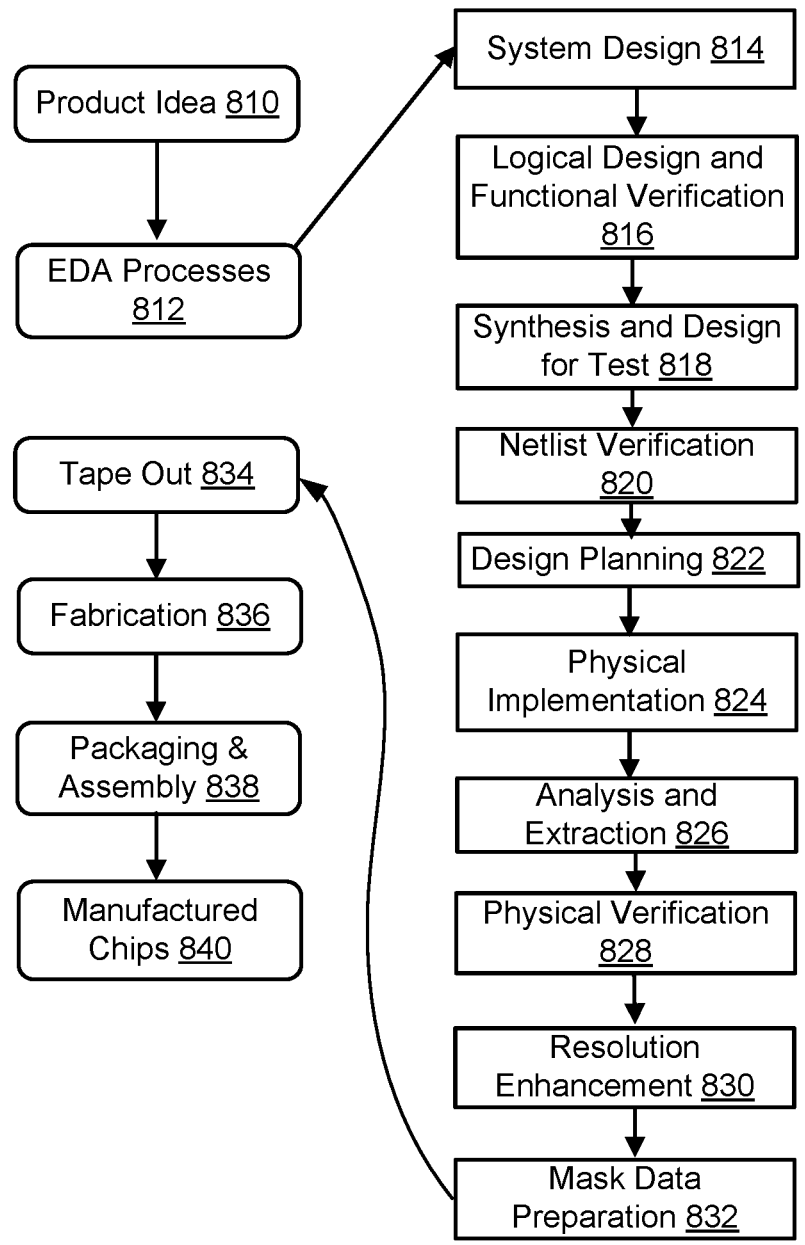
FIG. 8 depicts a flowchart of various processes used during the design and manufacture of an integrated circuit in accordance with some embodiments of the present disclosure.

FIG. 8 illustrates an example set of processes 800 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 810 with information supplied by a designer, information which is transformed to create an article of manufacture that uses a set of EDA processes 812. When the design is finalized, the design is taped-out 834, which is when artwork (e.g., geometric patterns) for the integrated circuit is sent to a fabrication facility to manufacture the mask set, which is then used to manufacture the integrated circuit. After tape-out, a semiconductor die is fabricated 836 and packaging and assembly processes 838 are performed to produce the finished integrated circuit 840.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are less more detailed can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 8. The processes described by be enabled by EDA products (or tools).

During system design 814, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 816, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 818, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 820, the netlist is checked for compliance with timing constraints and for correspondence with the HDL code. During design planning 822, an overall floor plan for the integrated circuit is constructed and analyzed for timing and top-level routing.

During layout or physical implementation 824, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 826, the circuit function is verified at the layout level, which permits refinement of the layout design. During physical verification 828, the layout design is checked to ensure that manufacturing constraints are correct, such as DRC constraints, electrical constraints, lithographic constraints, and that circuitry function matches the HDL design specification. During resolution enhancement 830, the geometry of the layout is transformed to improve how the circuit design is manufactured.

During tape-out, data is created to be used (after lithographic enhancements are applied if appropriate) for production of lithography masks. During mask data preparation 832, the 'tape-out' data is used to produce lithography masks that are used to produce finished integrated circuits.

A storage subsystem of a computer system (such as computer system 900 of FIG. 9) may be used to store the programs and data structures that are used by some or all of the EDA products described herein, and products used for development of cells for the library and for physical and logical design that use the library.

General Computer System Architecture

Figure 9:
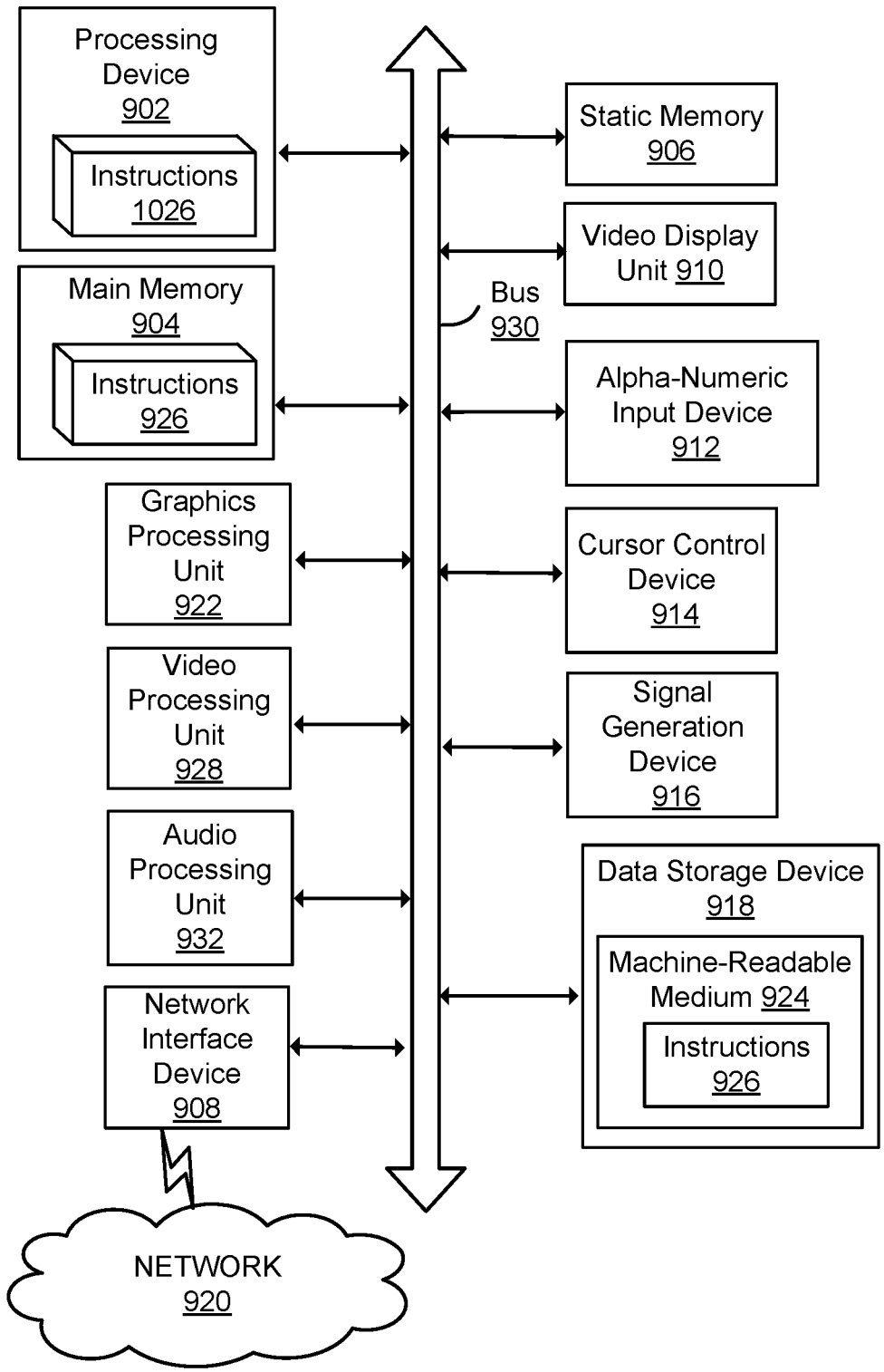
FIG. 9 depicts a diagram of an example computer system in which embodiments of the present disclosure may operate.

FIG. 9 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Additional Configuration Considerations

Example benefits and advantages of the disclosed configurations include enabling proper read operations of SRAM bitcells in low voltage operations. In particular, a sense amplifier trigger signal is delayed, allowing the voltage differential between bitlines to reach a sufficient differential for the sense amplifier to capture the proper value stored within the bitcell. The sequential delay enabler read timer circuit described herein provides an additional benefit of obtaining a similar delay as the inverter chain read timer circuit while minimizing the area occupied by the circuit. In particular, the inverter chain may occupy a larger area on a chip than the sequential delay enabler timer. For example, an inverter chain of thirty inverters occupies a larger space than a stack of five NMOS transistors, three PMOS transistors, and a gate capacitance.

An additional benefit of the sequential delay enabler timer over the inverter chain relates to dynamic power. Since a CLK signal enters an inverter chain, each switch from logic state to logic state of the CLK signal through an inverter contributes to the timer circuit's dynamic power consumption. This dynamic power may have a corresponding leakage, which increases with the number of components through which the switching signal travels through. For example, more current leaks through a chain of thirty inverters than through the components of a sequential delay enabler timer as shown in FIG. 4. Hence, the sequential delay enabler timer circuit also reduces the leakage current that might result from an inverter chain timer circuit.

Replacing the inverter chain and NMOS pull-down timer with a sequential delay enabler timer has a further advantage of minimizing the impact on cycle time of read operations from a bitcell. A read cycle may begin at CLK high and end when RBL pre-charges. For a read cycle using an inverter chain, the reset of RWL travels through the inverter chain before causing RBL to pre-charge. By comparison, for a read cycle using a sequential delay enabler timer, the reset of RWL may pass through less components than inverters in an inverter chain, which reduces the duration and impact of a read cycle on processing and power resources of the larger system in which the bitcell functions.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for a system and a process for obtaining a sufficient voltage differential between SRAM bitlines for read operations at low voltages through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. An integrated circuit, comprising:
  a memory cell array coupled to a bitline and a first wordline; and
  an NMOS pull-down structure coupled to the bitline and a plurality of PMOS transistors,
    wherein:

the plurality of PMOS transistors is coupled to a second wordline, a logic value carried on the second wordline based on a logic value carried on the first wordline, and structured to pre-charge a plurality of drains of the NMOS pull-down structure to a high logic value based on a low logic value carried on the second wordline, and the NMOS pull-down structure discharges the bitline based on a high logic value carried on the second wordline.

2. The integrated circuit of claim 1, wherein the NMOS pull-down structure comprises a plurality of NMOS transistors coupled in series.

3. The integrated circuit of claim 2, wherein drains of the plurality of PMOS transistors are coupled to the plurality of drains of the NMOS pull-down structure, sources of the plurality of PMOS transistors are coupled to a supply voltage, and gates of the plurality of PMOS transistors are coupled to the second wordline.

4. The integrated circuit of claim 1, further comprising a gate capacitance coupled to the NMOS pull-down structure such that the bitline is further discharged by the gate capacitance.

5. The integrated circuit of claim 4, wherein the gate capacitance is adjusted to modify an amount of time to discharge the bitline.

6. The integrated circuit of claim 1, further comprising a decoder coupled to the NMOS pull-down structure, wherein the decoder is structured to enable timing mode selection and output the logic value carried on the second wordline indicative of a selected timing mode, a time for the bitline to discharge dependent on the selected timing mode.

7. The integrated circuit of claim 1, wherein a plurality of sources of the NMOS pull-down structure are sequentially discharged based on the high logic value carried on the second wordline.

8. The integrated circuit of claim 7, further comprising a gate capacitance coupled to an NMOS transistor of the NMOS pull-down structure having a source that is last to discharge.

9. The integrated circuit of claim 1, wherein the memory cell array has a static random access memory architecture.

10. A non-transitory computer readable medium comprising stored instructions to generate a digital representation of an integrated circuit for performing a read operation, the integrated circuit comprising:
a memory cell array coupled to a bitline and a first wordline, the memory cell array having a static random access memory architecture; and
an NMOS pull-down structure coupled to the bitline and a plurality of PMOS transistors, the plurality of PMOS transistors coupled to a second wordline, a logic value carried on the second wordline based on a logic value carried on the first wordline, and structured to pre-charge a plurality of drains of the NMOS pull-down structure to a high logic value based on a low logic value carried on the second wordline, the NMOS pull-down structure discharges the bitline based on a high logic value carried on the second wordline.

11. The non-transitory computer readable medium of claim 10, wherein the NMOS pull-down structure comprises a plurality of NMOS transistors coupled in series.

12. The non-transitory computer readable medium of claim 11, wherein drains of the plurality of PMOS transistors are coupled to the plurality of drains of the NMOS pull-down structure, sources of the plurality of PMOS transistors are coupled to a supply voltage, and gates of the plurality of PMOS transistors are coupled to the second wordline.

13. The non-transitory computer readable medium of claim 10, further comprising a gate capacitance coupled to the NMOS pull-down structure such that the bitline is further discharged by the gate capacitance.

14. The non-transitory computer readable medium of claim 13, wherein the gate capacitance may be adjusted to modify an amount of time to discharge the bitline.

15. The non-transitory computer readable medium of claim 10, further comprising a decoder coupled to the NMOS pull-down structure, wherein the decoder is structured to enable timing mode selection and output the logic value carried on the second wordline indicative of a selected timing mode, a time for the bitline to discharge dependent on the selected timing mode.

16. The non-transitory computer readable medium of claim 10, wherein a plurality of sources of the NMOS pull-down structure are sequentially discharged based on the high logic value carried on the second wordline.

17. The non-transitory computer readable medium of claim 16, further comprising a gate capacitance coupled to an NMOS transistor of the NMOS pull-down structure having a source that is last to discharge.

18. The non-transitory computer readable medium of claim 10, wherein the memory cell array has a static random access memory architecture.

19. A method for performing a read operation comprising:
pre-charging a plurality of drains of an NMOS pull-down structure of an integrated circuit using a plurality of PMOS transistors to a high logic value based on a low logic value carried on a second wordline, the NMOS pull-down structure coupled to a bitline and the plurality of PMOS transistors, wherein the plurality of PMOS transistors is coupled to the second wordline, a logic value carried on the second wordline based on a logic value carried on a first wordline; and
discharging the bitline, by the NMOS pull-down structure, based on a high logic value carried on the second wordline, wherein the integrated circuit comprises:
a memory cell array coupled to the bitline and the first wordline, and
the NMOS pull-down structure.

20. The method of claim 19, wherein discharging the bitline further comprises discharging the bitline by a gate capacity coupled to the NMOS pull-down structure.

* * * * *